(12) United States Patent
Zhou et al.

(10) Patent No.: US 7,161,396 B1
(45) Date of Patent: Jan. 9, 2007

(54) CMOS POWER ON RESET CIRCUIT

(75) Inventors: Shi-Dong Zhou, Milpitas, CA (US); Gubo Huang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 187 days.

(21) Appl. No.: 10/644,156

(22) Filed: Aug. 20, 2003

(51) Int. Cl.
*H03L 7/00* (2006.01)

(52) U.S. Cl. ...................................... 327/143; 327/198

(58) Field of Classification Search ........ 327/142–143, 327/198, 543, 80
See application file for complete search history.

(56) References Cited

U.S. PATENT DOCUMENTS

| | | | | |
|---|---|---|---|---|
| 4,626,954 A | * | 12/1986 | Damiano et al. | 361/96 |
| 4,716,323 A | * | 12/1987 | Wada et al. | 327/50 |
| 4,717,840 A | * | 1/1988 | Ouyang et al. | 327/143 |
| 5,534,804 A | | 7/1996 | Woo | |
| 5,852,377 A | * | 12/1998 | Pitsch | 327/143 |
| 6,137,324 A | * | 10/2000 | Chung | 327/143 |
| 6,181,173 B1 | * | 1/2001 | Homol et al. | 327/143 |
| 6,472,912 B1 | * | 10/2002 | Chiu et al. | 327/143 |
| 6,492,850 B1 | * | 12/2002 | Kato et al. | 327/143 |
| 6,683,481 B1 | * | 1/2004 | Zhou et al. | 327/143 |

* cited by examiner

*Primary Examiner*—Timothy P. Callahan
*Assistant Examiner*—Cassandra Cox
(74) *Attorney, Agent, or Firm*—William L. Paradice, III; Justin Liu

(57) ABSTRACT

A power-on reset circuit for generating a reset signal for an associated IC device includes a pull-up resistor connected between a supply voltage and a tracking node, a pull-down transistor connected between the tracking node and ground potential, and a voltage divider circuit connected between the supply voltage and ground potential. The voltage divider circuit has a first ratioed voltage node coupled to the gate of the pull-down transistor. For some embodiments, the voltage divider circuit includes a first resistor connected between the voltage supply and the first ratioed voltage node, a second resistor connected between the first ratioed voltage node and a second ratioed voltage node, a third resistor connected between the second ratioed voltage node and ground potential, and a shunt transistor connected between the second ratioed voltage node and ground potential has a gate responsive to the reset signal.

25 Claims, 4 Drawing Sheets

CMOS POWER ON RESET CIRCUIT

FIELD OF INVENTION

The present invention relates generally to integrated circuits, and more specifically to power-on reset circuits.

DESCRIPTION OF RELATED ART

When an integrated circuit (IC) device is powered on, it is important that the device's internal logic is set to a known state to ensure proper operation. For example, if one or more latches power-up into an undesirable state, the device may not function properly. Thus, most IC devices include a power-on reset (POR) circuit that asserts a reset signal when a supply voltage is detected and then de-asserts the reset signal when the supply voltage has reached an acceptable level that is sufficient for the device's normal operation. When asserted, the reset signal is typically used to reset the device's internal logic to a known state. When de-asserted, the reset signal is typically used to terminate the reset operation and allow the device to commence normal operation. The POR circuit can also be used to assert the reset signal when the supply voltage falls below an acceptable level (e.g., during device power-down).

FIG. 1 shows a prior art POR circuit 100 for generating a power-on reset signal RST for an associated IC device (not shown for simplicity). POR circuit 100 includes a PMOS transistor 101, NMOS transistors 102–104, a diode-connected NMOS transistor 105, resistors 106–107, and an inverter 108. Resistors 106–107 and diode 105, which are connected in series between a supply voltage VDD and ground potential, form a voltage divider at node 111, which is coupled to the input of a CMOS inverter 110 formed by PMOS transistor 101 and NMOS transistor 102. The output 112 of CMOS inverter 110 provides RST. NMOS transistors 103 and 104 are connected in series between output node 112 and ground potential, with the gate of transistor 103 coupled to node 111 and the gate of transistor 104 coupled to the output of inverter 108. Inverter 108 is configured to logically invert RST to generate its complement $\overline{RST}$.

When POR circuit 100 is powered-up, VDD rises from 0 volts to its normal operating voltage. Node 111, which is initially at or near ground potential, turns on PMOS transistor 101 and turns off NMOS transistors 102 and 103, thereby charging node 112 toward VDD through PMOS transistor 101. The resulting logic high state of RST is inverted by inverter 108 to generate a logic low $\overline{RST}$ that maintains NMOS transistor 104 in a non-conductive state. The increasing operating voltage VDD also charges node 111 through resistor 106, albeit more slowly than node 112. When the voltage at node 111 reaches the trip point of CMOS inverter 110, PMOS transistor 101 turns off and NMOS transistor 102 turns on, thereby discharging node 112 to ground potential and de-asserting RST to logic low.

The rising voltage at node 111 also turns on transistor 103, and inverter 108 inverts RST to generate a logic high $\overline{RST}$ which turns on NMOS transistor 104. Thus, when RST is de-asserted to logic low, transistors 103 and 104 provide an additional discharge path to ground potential for output node 112.

POR circuit 100 can also assert RST to logic high when VDD decreases below an acceptable level. For example, when VDD decreases below its normal operating voltage, the voltage at node 111 also decreases. When the voltage on node 111 falls below the trip point of CMOS inverter 110, NMOS transistors 102 and 103 turn off and PMOS transistor 101 turns on, thereby charging node 112 toward VDD to assert RST to logic high. Inverter 108 inverts RST to generate a logic low $\overline{RST}$ which turns off NMOS transistor 104, thereby isolating output node 112 from ground potential.

The voltage level of VDD at which RST is de-asserted during power-up is typically referred to as the power-up reset (PUR) level, and the voltage level of VDD at which RST is asserted during power-down is typically referred to as the power-down reset (PDR) level. For POR circuit 100, the PUR and PDR levels are largely dependent upon the threshold voltage VTP of PMOS transistor 101 and the threshold voltages VTN of NMOS transistors 102 and 105. However, because transistor threshold voltages typically vary with process variations inherent in semiconductor fabrication technologies, as well as with temperature variations, the PUR and PDR levels for circuit 100 can vary with process and temperature variations. Further, mismatches between the threshold voltage VTP of PMOS transistor 101 and the threshold voltage VTN of NMOS transistor 102 can alter the switching characteristics of CMOS inverter 110, which can result in additional variations in the PUR and PDR levels.

As operating voltages for IC devices continue to decrease, increasing precision is required for the PUR and PDR levels of a POR circuit. Therefore, there is need for a POR circuit having more precise PUR and PDR levels that are less sensitive to process and temperature variations.

SUMMARY

A power-on reset (POR) circuit for generating a reset signal for an associated IC device includes a voltage divider circuit, a switching circuit, and a buffer circuit. The switching circuit includes a pull-up resistor connected between a supply voltage and a tracking node, and a pull-down transistor connected between the tracking node and ground potential. The gate of the pull-down transistor is controlled by a ratioed voltage created by the voltage divider circuit. The buffer circuit drives the reset signal in response to the voltage level at the tracking node.

When the IC device is powered-on, the POR circuit asserts the reset signal, which in turn can be used to reset the device to a known state. As the supply voltage increases, the tracking node voltage charges through the pull-up resistor and tracks the supply voltage. In response thereto, the buffer circuit asserts the reset signal to logic high. When the supply voltage reaches a predetermined power-up reset level, the pull-down transistor turns on and discharges the tracking node toward ground potential. In response thereto, the buffer circuit de-asserts the reset signal to logic low, which in turn can be used to terminate the reset operation. During device power-down, the reset signal is initially de-asserted to logic low. When the supply voltage decreases below a predetermined power-down reset level, the pull-down transistor turns off and allows the tracking node to charge through the pull-up resistor, which in turn causes the buffer circuit to assert the reset signal to logic high. The asserted logic high reset signal can be used to reset the device to a known state before power is lost.

Because the pull-down transistor is controlled by a ratioed voltage created by the voltage divider circuit in response to the supply voltage, the power-up and power-down reset levels can be adjusted by manipulating the relative resistances in the voltage divider circuit. This is advantageous because process and temperature variations typically affect the resistors in the voltage divider circuit similarly, and therefore cancel each other when determining the ratioed voltage. In this manner, the power-up and power-down reset levels can be set to predetermined multiples of the threshold voltage VTN of the pull-down transistor, and are less sensitive to process and temperature variations.

For some embodiments, the voltage divider circuit includes a shunt transistor that can be used to increase or decrease the ratioed voltage to create hysteresis between the power-up and power-down reset levels.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is applicable to a variety of integrated circuits and systems. The present invention has been found to be particularly applicable and beneficial for providing reset signals during power-up and power-down operations for programmable logic devices, although embodiments of the present invention are equally applicable to other circuits and devices. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary, and thus can be modified (e.g., reversed polarity) as desired. Accordingly, the present invention is not to be construed as limited to specific examples described herein but rather includes within its scope all embodiments defined by the appended claims.

Figure 1:
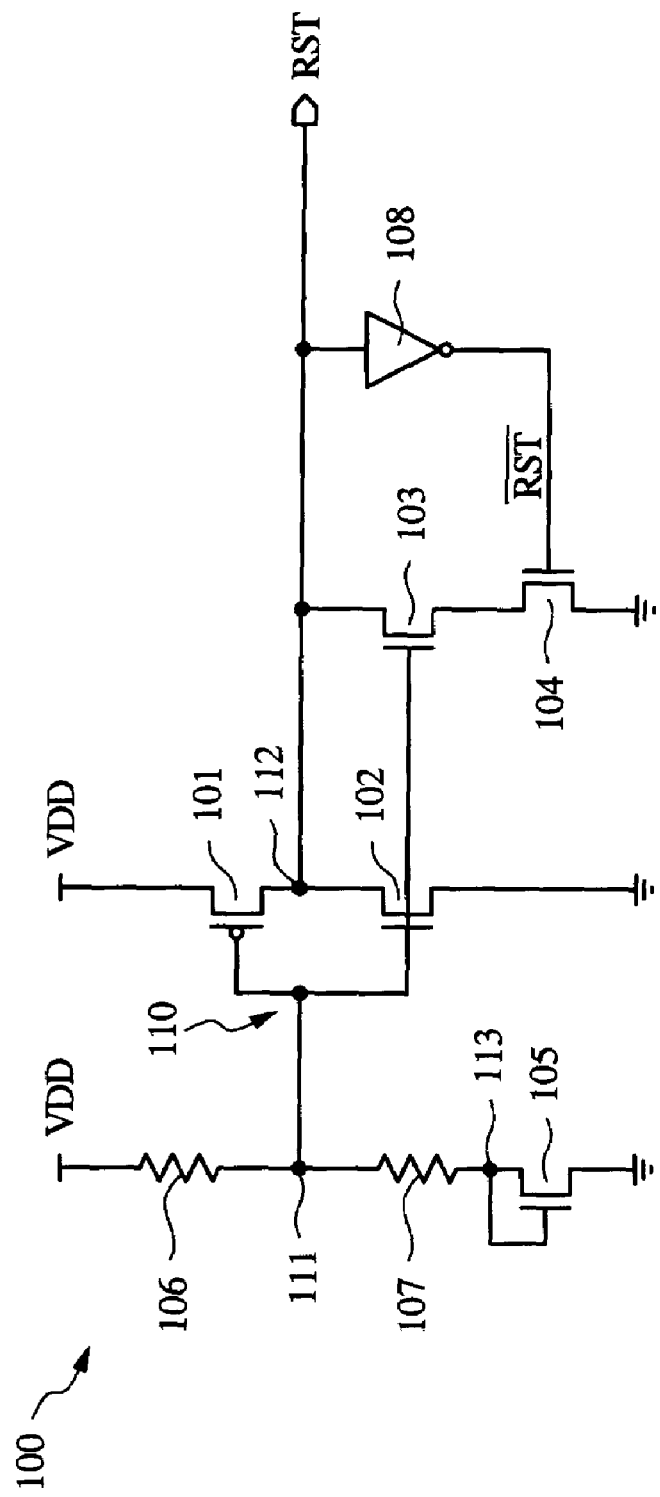
FIG. 1 is a circuit diagram of a conventional power-on reset circuit.
Figure 2:
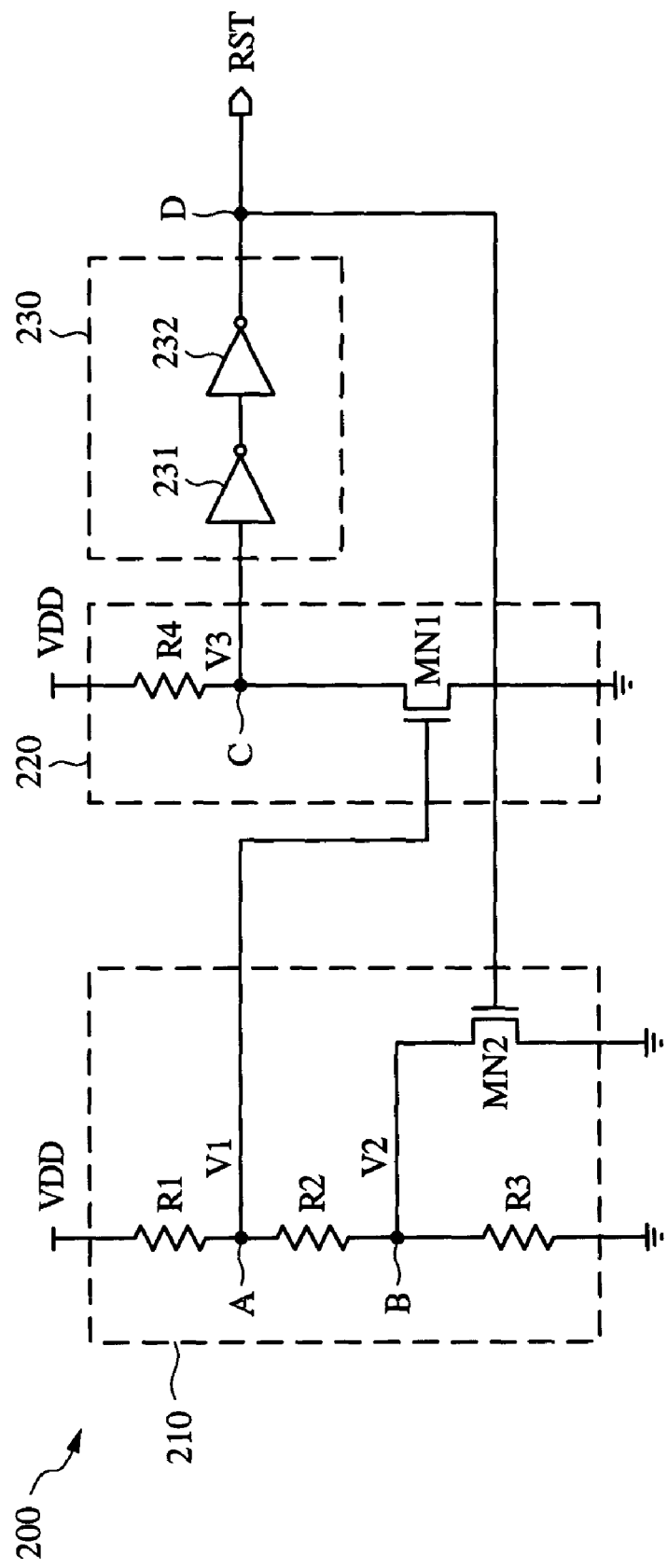
FIG. 2 is a circuit diagram of a power-on reset circuit in accordance with one embodiment of the present invention.

FIG. 2 shows a circuit diagram of a power-on reset (POR) circuit 200 in accordance with the present invention. POR circuit 200 is configured to generate a reset signal RST at output node D, and includes a voltage divider circuit 210, a switching circuit 220, and a buffer circuit 230. Voltage divider circuit 210 includes resistors R1, R2, and R3, and an NMOS shunt transistor MN2. Resistors R1–R3, which are connected in series between a supply voltage VDD and ground potential, generate a first ratioed voltage V1 at a first node A between resistors R1 and R2, and generate a second ratioed voltage V2 at a second node B between resistors R2 and R3. NMOS transistor MN2 is connected in parallel across resistor R3 and has a gate coupled to output node D. NMOS transistor MN2 can be used to adjust the first ratioed voltage V1 by selectively shorting node B to ground potential in response to RST. For example, when transistor MN2 is not conductive, $V1=VDD*(R2+R3)/(R1+R2+R3)$ and $V2=VDD*R3/(R1+R2+R3)$. When transistor MN2 is conductive, $V1=VDD*R2/(R1+R2)$ and V2 is grounded. Thus, the ratioed voltage V1 at node A can be increased by turning off transistor MN2 or decreased by turning on transistor MN2.

Switching circuit 220 includes a pull-up resistor R4 and an NMOS pull-down transistor MN1 connected in series between VDD and ground potential, with the gate of pull-down transistor MN1 responsive to the first ratioed voltage V1. A tracking node C between resistor R4 and transistor MN1 is connected to an input of buffer circuit 230, which in turn includes inverters 231 and 232 and is configured to drive RST in response to a tracking voltage V3 at node C. Inverters 231 and 232 have power terminals (not shown for simplicity) coupled to VDD and to ground potential, and can be any suitable inverter circuits such as the well-known CMOS inverter 300 shown in FIG. 3.

Figure 3:
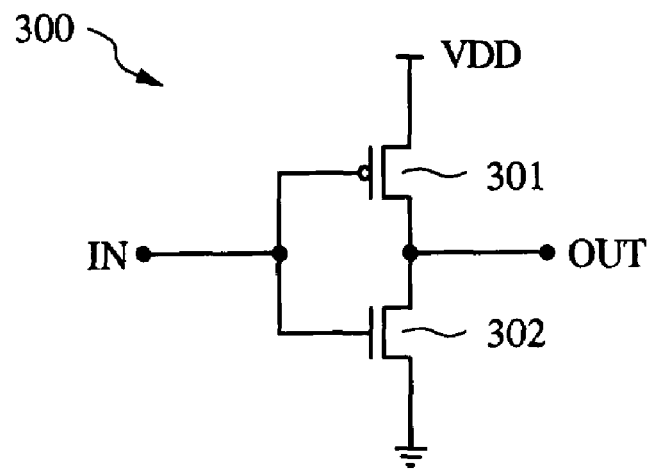
FIG. 3 is a circuit diagram of a CMOS inverter for one embodiment of the power-on reset circuit of FIG. 2.

Referring to FIGS. 2 and 3, for some embodiments, PMOS transistor 301 and NMOS transistor 302 of inverter 300 are low voltage transistors having low threshold voltage to create a low trip point for buffer circuit 230. For one embodiment, the trip point of buffer circuit 230 is approximately 0.3 volts, although other trip points can be used. For other embodiments, buffer circuit 230 can include other numbers of inverters. For still other embodiments, buffer circuit 230 can be eliminated.

The reset signal RST can be used to control reset operations for an IC device associated with POR circuit 200. For simplicity, the associated IC device is not shown in FIG. 2. For some embodiments, POR circuit 200 asserts RST to logic high when the supply voltage VDD is detected, and de-asserts RST to logic low when VDD reaches a level sufficient for normal operation of the associated device. The asserted state of RST can be used to reset the associated device to a known state, and the de-asserted state of RST can be used to terminate the reset operation and thereby allow the device to operate normally.

For example, during device power-up, VDD increases from 0 volts to its normal operating level. Initially, node A is logic low and maintains NMOS pull-down transistor MN1 in a non-conductive state, thereby isolating node C from ground potential. RST is initially logic low, which maintains NMOS transistor MN2 in a non-conductive state. As VDD rises, the tracking voltage V3 at node C quickly charges toward VDD through resistor R4 and tracks VDD in a linear manner. The rising voltage V3 causes buffer circuit 230 to assert RST to logic high.

The logic high state of RST turns on shunt transistor MN2, thereby reducing V1 by shorting node B to ground potential. The ratioed voltage V1 at node A continues to increase in response to the rising operating voltage of VDD. When V1 exceeds the threshold voltage VTN of NMOS pull-down transistor MN1, transistor MN1 turns on and quickly discharges tracking node C to ground potential. In response thereto, buffer circuit 230 de-asserts RST to logic low. The logic low state of RST turns off transistor MN2, thereby increasing the ratioed voltage V1 at node A which, in turn, more strongly turns on pull-down transistor MN1.

POR circuit 200 maintains RST in the logic low state until VDD falls below a level that is sufficient for normal operation of its associated IC device, and then asserts RST to logic high. The asserted logic high state of RST can be used to reset the associated IC device to a known state before power is lost.

For example, during a power-down operation, VDD begins to fall from its normal operating voltage, which in turn causes the ratioed voltages V1 and V2 at respective nodes A and B to decrease. When V1 falls below the VTN of pull-down transistor MN1, transistor MN1 turns off and isolates node C from ground potential, thereby allowing tracking node C to quickly charge toward VDD through resistor R4. In response to the rising voltage V3, buffer circuit 230 asserts RST to logic high. Once asserted, the logic high RST turns on transistor MN2, thereby further reducing the voltage V1 by shorting node B to ground potential.

The level of VDD at which POR circuit 200 de-asserts RST during power-up is determined by the threshold voltage VTN of pull-down transistor MN1 and by the relative resistances in voltage divider circuit 210. Because shunt transistor MN2 is conductive prior to POR circuit 200 de-asserting RST during power-up, the power-up reset (PUR) level for POR circuit 200 is PUR=(VTN)(R1+R2)/R2=X*VTN, where X=(R1+R2)/R2 is a power-up factor that can be adjusted by manipulating the resistances of R1 and R2. Similarly, the level of VDD at which POR circuit 200 asserts RST during power-down is determined by the threshold voltage VTN of pull-down transistor MN1 and by the relative resistances in voltage divider circuit 210. Because shunt transistor MN2 is not conductive prior to POR circuit 200 asserting RST during power-down, the power-down reset (PDR) level for POR circuit 200 is PDR=(VTN)(R1+R2+R3)/(R2+R3)=Y*VTN, where Y=(R1+R2+R3)/(R2+R3) is a power-down factor that can be adjusted by manipulating the resistances of R1, R2, and R3.

As described above, the PUR and PDR levels for POR circuit 200 can be controlled by adjusting the power-up factor X and the power-down factor Y, respectively. This is advantageous because process and temperature variations typically affect resistors R1–R3 in a similar manner, and therefore cancel each other when determining the ratio factors X and Y. For example, a 10% increase in the values of resistors R1, R2, and R3 resulting from process and/or temperature variations do not affect the values of x and Y, thereby allowing the PUR and PDR levels of POR circuit 200 to be expressed as predetermined multiples (e.g., X and Y) of the threshold voltage VTN of pull-down transistor MN1. In this manner, the PUR and PDR levels of POR circuit 200 are less sensitive to process and temperature variations than prior art POR circuit 100.

Further, because node C is charged through a purely resistive element R4, node C tracks VDD in a linear manner, which in turn can result in RST being asserted sooner during device power-up. Asserting RST sooner during power-up is desirable because it can allow the reset operation to commence earlier and thereby complete before VDD reaches its normal operating level.

Note that because the power-up factor X is greater than the power-down factor Y, irrespective of the resistance values for R1–R3, PUR is always greater than PDR. In this manner, shunt transistor MN2 provides hysteresis between the PUR and PDR levels that can be adjusted by manipulating the value of R3. For other embodiments, transistor MN2 and resistor R3 can be eliminated.

An exemplary operation for one embodiment of POR circuit 200 fabricated using a 0.18 micron process technology with a supply voltage VDD=1.8 volts is described below with respect to the timing diagram of FIG. 4. For this exemplary embodiment, resistor R1=300 kΩ, R2=200 kΩ, R3=400 kΩ, and VTN_MN1=0.4 volts. Thus, PUR=X*VTN=[(300+200)/200]*VTN=2.5*VTN=1.0 volts and PDR=Y*VTN=[(300+200+400)/(200+400)]*VTN=1.5*VTN=0.6 volts.

Figure 4:
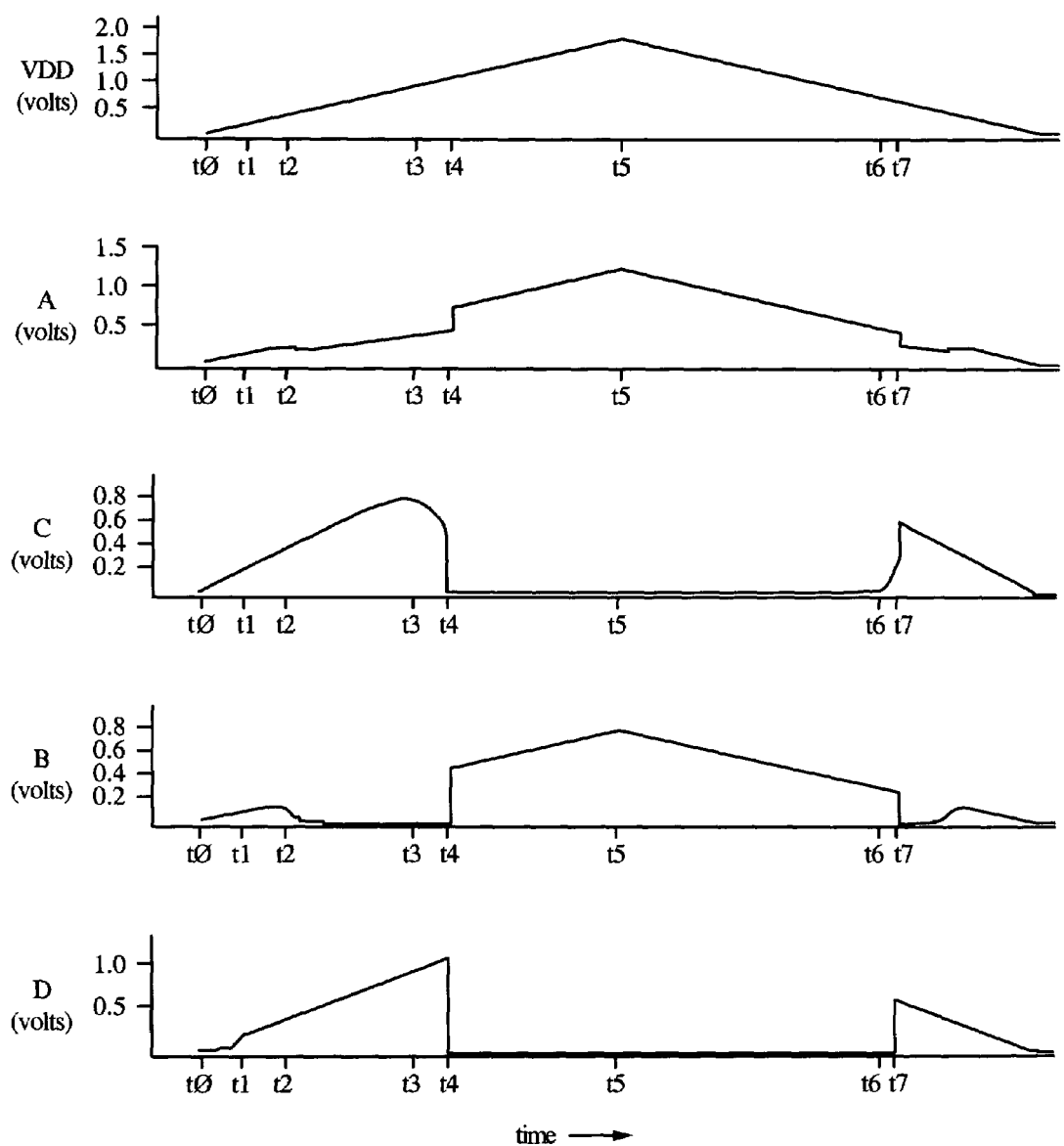
FIG. 4 is a timing diagram for an exemplary operation of one embodiment of the power-on reset circuit of FIG. 2.

Referring now to FIGS. 2 and 4, initially (at time t0), no operational voltage (VDD=0 volts) is applied to POR circuit 200, and nodes A, B, C, and D are all at or near ground potential. Thus, NMOS transistors MN1 and MN2 are non-conductive, and RST is in a de-asserted logic low state at time t0. As VDD begins rising to its operational voltage of 1.8 volts, tracking node C quickly charges toward VDD through resistor R4, and nodes A and B more slowly charge toward VDD through resistors R1 and R2. By time t1, the rising voltage V3 at node C is sufficient to cause buffer circuit 230 to begin charging output node D toward VDD. By time t2, the voltage level of RST at output node D is sufficient to turn on NMOS transistor MN2, which in turn shorts node B to ground potential and momentarily stalls the increase in voltage V1 at node A. By time t3, VDD reaches a level (e.g., VDD=PUR=1.0 volts) that results in a voltage V1 at node A (e.g., V1>0.4 volts) sufficient to turn on pull-down transistor MN1, which begins discharging tracking node C toward ground potential. In response thereto, buffer circuit 230 discharges node D to ground potential by time t4, thereby de-asserting RST to logic low. The resulting logic low state of RST turns off transistor MN2, which causes voltage increases at nodes A and B.

By time t5, VDD begins decreasing from its operational level of 1.8 volts, for example, during device power-down. As VDD decreases, the voltages at nodes A and B also decrease. By time t6, VDD falls to a level (e.g., VDD=PDR=0.6 volts) that results in a voltage V1 at node A (e.g., V1<0.4 volts) which turns off pull-down transistor MN1 to allow tracking node C to quickly charge toward VDD through resistor R4. In response thereto, buffer circuit 230 drives node D toward VDD at time t7, thereby asserting RST to logic high. The resulting logic high state of RST turns on transistor MN2, which in turn shorts node B to ground potential and causes a voltage drop at node A. Thereafter, the voltages at nodes A–D continue to decrease in response to the falling level of VDD.

The channel widths and lengths of transistors which form the exemplary embodiment of POR circuit 200 described above with respect to FIG. 4 are listed below in Table 1.

TABLE 1

| Transistor | Width (microns) | Length (microns) |
| --- | --- | --- |
| MN1 | 4.0 | 2.0 |
| MN2 | 20.0 | 0.22 |
| 301 | 3.2 | 0.75 |
| 302 | 1.5 | 0.75 |

Although specific widths and lengths are provided in Table 1, each dimension is typically within an acceptable range or tolerance. For some embodiments, the range is plus or minus 10% of the dimension specified in Table 1. Known simulation programs, such as the HSPICE program, can be used to manipulate transistor dimensions for optimum performance.

For some embodiments, the resistance of resistor R4 is relatively large, as compared to resistors R1–R3, to minimize the effect of process variations upon resistor R4, which in turn maximizes the precision with which the PUR and PDR levels can be selected. For one embodiment, resistor R4=1 MΩ, although other resistance values for resistor R4 can be used.

Figure 5:
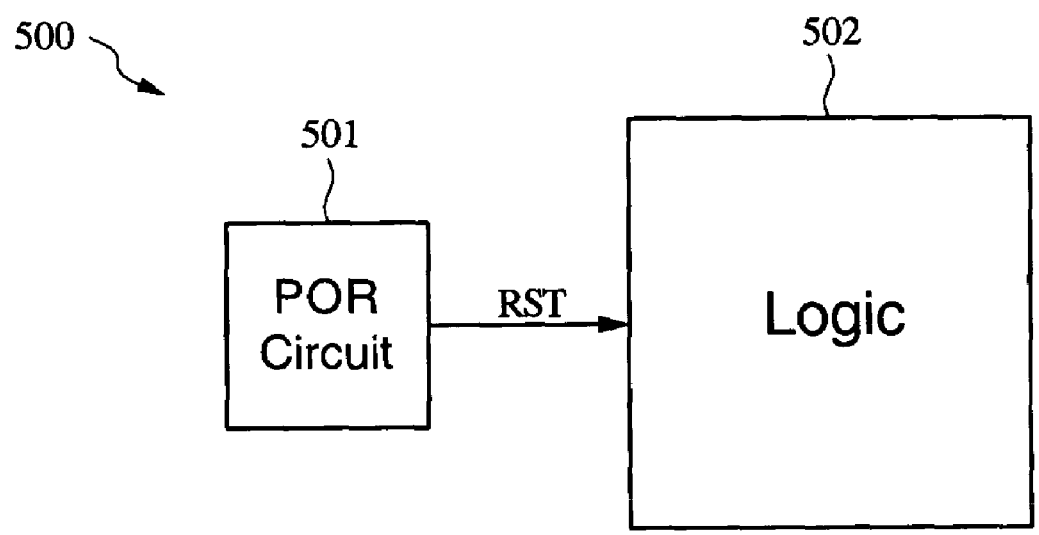
FIG. 5 is a block diagram illustrating the power-on reset circuit of FIG. 2 as part of an IC device.

FIG. 5 shows an IC device 500 having a POR circuit 501 that provides a reset signal RST to associated logic 502. POR circuit 501 is one embodiment of POR circuit 200 of FIG. 2, and can either be implemented within device 500 or external to device 500. IC device 500 can be any suitable device, and logic 502 can include any logic circuits or components for which reset operations during device power-up and device power-down are desirable. For some embodiments, device 500 is a programmable logic device (PLD) such as a field programmable gate array (FPGA) or a complex programmable logic device (CPLD). For such embodiments, logic 502 can include configurable logic blocks (CLBs), input/output (I/O) blocks, a programmable switch matrix, configuration memory cells, or other well-known PLD components.

During power-up of device 500, POR circuit 501 asserts RST to logic high as VDD increases to its normal operating level. The asserted logic high state of RST can be used to reset logic 502 to a known state to ensure proper operation when VDD reaches its normal operating level. When VDD reaches the PUR level of POR circuit 501, which corresponds to a level of VDD sufficient for normal operation of device 500, POR circuit 501 de-asserts RST to logic low. The logic low state of RST can be used to terminate the reset operation of logic 502, and thereafter enable normal operation of device 500. During power-down of device 500, POR circuit 501 asserts RST to logic high when VDD falls below an acceptable level indicated by the PDR level. The asserted logic high state of RST can be used to reset logic 502 to a known state before power to device 500 is turned off.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A power-on reset circuit to generate a reset signal, comprising:
    a pull-up resistor connected between a supply voltage and a tracking node;
    a pull-down transistor connected between the tracking node and ground potential, the tracking node generating a voltage indicative of the reset signal; and
    a voltage divider circuit connected between the supply voltage and ground potential, the voltage divider circuit having a first ratioed voltage node coupled to the gate of the pull-down transistor, wherein the voltage divider circuit comprises:
    a first resistor connected between the voltage supply and the first ratioed voltage node;
    a second resistor connected between the first ratioed voltage node and a second ratioed voltage node;
    a third resistor connected between the second ratioed voltage node and ground potential; and
    a shunt transistor connected between the second ratioed voltage node and ground potential, and having a gate responsive to the reset signal.

2. The circuit of claim 1, wherein the POR circuit de-asserts the reset signal when the supply voltage reaches a power-up reset level, and asserts the reset signal when the supply voltage falls below a power-down reset level.

3. The circuit of claim 2, wherein the power-up reset level comprises a first factor multiplied by a threshold voltage of the pull-down transistor, the first factor determined by the relative resistances of the first and second resistors.

4. The circuit of claim 3, wherein the power-down reset level comprises a second factor multiplied by the threshold voltage of the pull-down transistor, the second factor determined by the relative resistances of the first, second, and third resistors.

5. The circuit of claim 4, wherein the first and second factors comprise resistance ratios characterized by the voltage divider circuit.

6. The circuit of claim 2, wherein the shunt transistor selectively shunts the third resistor in response to the reset signal to provide hysteresis between the power-up reset level and the power-down reset level.

7. The circuit of claim 6, wherein the hysteresis between the power-up reset level and the power-down reset level is determined by the third resistor.

8. The circuit of claim 1, wherein the pull-down and shunt transistors comprise NMOS transistors.

9. The circuit of claim 1, further comprising:
    a buffer circuit having an input coupled to the tracking node and an output to generate the reset signal.

10. The circuit of claim 9, wherein the buffer circuit comprises:
    a first inverter having an input coupled to the tracking node, and having an output; and
    a second inverter having an input coupled to the output of the first inverter and having an output to generate the reset signal.

11. The circuit of claim 1, wherein the circuit is part of a programmable logic device.

12. A power-on reset circuit to generate a reset signal, comprising:
    a first resistor connected between a voltage supply and a first ratioed voltage node;
    a second resistor connected between the first ratioed voltage node and a second ratioed voltage node;
    a third resistor connected between the second ratioed voltage node and ground potential;
    a pull-up resistor connected between the supply voltage and a tracking node, the tracking node generating a voltage indicative of the reset signal;
    a first transistor connected between the tracking node and ground potential, and having a gate coupled to the first ratioed voltage node; and
    a second transistor connected between the second ratioed voltage node and ground potential, and having a gate responsive to the reset signal.

13. The circuit of claim 12, wherein the POR circuit de-asserts the reset signal when the supply voltage reaches a power-up reset level, and asserts the reset signal when the supply voltage falls below a power-down reset level.

14. The circuit of claim 13, wherein the power-up reset level is a predetermined multiple of a threshold voltage of the first transistor, the predetermined multiple determined by a ratio of resistances of the first and second resistors.

15. The circuit of claim 13, wherein the power-down reset level is a predetermined multiple of a threshold voltage of the first transistor, the predetermined multiple determined by a ratio of resistances of the first, second, and third resistors.

16. The circuit of claim 12, wherein the second transistor selectively shunts the third resistor in response to the reset signal.

17. The circuit of claim 12, wherein the first and second transistors comprise NMOS transistors.

18. The circuit of claim 12, further comprising:
    a buffer circuit having an input coupled to the tracking node and an output to generate the reset signal.

19. The circuit of claim 18, wherein the buffer circuit comprises:

a first inverter having an input coupled to the tracking node, and having an output; and a second inverter having an input coupled to the output of the first inverter and having an output to generate the reset signal.

20. The circuit of claim 12, wherein the POR circuit is part of a programmable logic device.

21. A power-on reset circuit to generate a reset signal, comprising:

a pull-up resistor connected between a supply voltage and a tracking node;

a pull-down transistor connected between the tracking node and ground potential, and having a gate responsive to a control voltage;

means for generating the control voltage as a predetermined factor of a threshold voltage of the pull-down transistor; and means for selectively adjusting the predetermined factor in response to the reset signal.

22. A power-on reset circuit to generate a reset signal, comprising:

a pull-up resistor connected between a supply voltage and a tracking node;

a pull-down transistor connected between the tracking node and ground potential, and having a gate responsive to a control voltage;

means for selectively adjusting the predetermined factor in response to the reset signal; and means for generating the control voltage as a predetermined factor of a threshold voltage of the pull-down transistor, wherein the means for generating comprises:

a first resistor connected between the voltage supply and a first ratioed voltage node;

a second resistor connected between the first ratioed voltage node and a second ratioed voltage node; and a third resistor connected between the second ratioed voltage node and ground potential.

23. The circuit of claim 22, wherein the means for selectively adjusting comprises a shunt transistor connected in parallel with the third resistor and having a gate responsive to the reset signal.

24. A method for generating a reset signal, comprising:

providing a pull-up resistor connected between a supply voltage and a tracking node;

providing a pull-down transistor connected between the tracking node and ground potential;

generating a control voltage using a voltage divider circuit; and controlling the conductivity of the pull-down transistor with the control voltage; and selectively adjusting the predetermined fraction in response to the reset signal.

25. The method of claim 24, wherein the control voltage comprises a predetermined fraction of the supply voltage.

* * * * *